(12) United States Patent
Guthaus et al.

(10) Patent No.: US 8,719,748 B2
(45) Date of Patent: May 6, 2014

(54) DISTRIBUTED RESONANT CLOCK GRID SYNTHESIS

(75) Inventors: Matthew Guthaus, Santa Cruz, CA (US); Xuchu Hu, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 40 days.

(21) Appl. No.: 13/531,531

(22) Filed: Jun. 23, 2012

(65) Prior Publication Data

US 2013/0154727 A1    Jun. 20, 2013

Related U.S. Application Data

(60) Provisional application No. 61/502,626, filed on Jun. 29, 2011.

(51) Int. Cl.
*G06F 9/455*   (2006.01)
*G06F 17/50*   (2006.01)

(52) U.S. Cl.
USPC ........................................... 716/113; 716/114

(58) Field of Classification Search
USPC .................................................. 716/113, 114
See application file for complete search history.

(56) References Cited

U.S. PATENT DOCUMENTS

2010/0229142 A1* 9/2010 Masleid et al. ................. 716/10
2013/0152035 A1* 6/2013 Berry et al. .................... 716/131

* cited by examiner

*Primary Examiner* — Suresh Memula
(74) *Attorney, Agent, or Firm* — Adam Warwick Bell; Matthew Rupert Kaser

(57) ABSTRACT

A method of implementing a VLSI clock network is implemented. That method includes a step of generating an initial VLSI clock grid for incorporation on a silicon die. An input grid buffer is then sized and implemented for the VLSI clock grid. LC tanks are then placed and sized in the VLSI clock grid to implement a resonant tank clock grid and the input grid buffer is resized. A check of the resonant tank design criteria is then made. If the design criteria are met the resonant VLSI clock grid with its LC tanks is implemented. If not, another attempt at implementing a suitable LC tanks placement and sizing is made. The process iterates until a VLSI clock grid that meets the design criteria is obtained.

20 Claims, 4 Drawing Sheets

DISTRIBUTED RESONANT CLOCK GRID SYNTHESIS

RELATIONSHIP TO OTHER APPLICATIONS

To the extent allowed by law this application claims priority to and the benefit of U.S. provisional application No. 61/502,626 entitled "DISTRIBUTED RESONANT CLOCK GRID SYNTHESIS" filed on Jun. 29, 2011 having inventors Dr. Matthew Guthaus and Xuchu Hu. That application is hereby incorporated by reference to the fullest extent allowed by law.

FIELD OF THE INVENTION

The presently disclosed subject matter is directed towards the synthesis of clock distribution networks that use distributed inductor-capacitor (LC) tanks with asymmetric clock loads.

BACKGROUND OF THE INVENTION

The on-going demand for high performance electronic systems has driven the need for high-speed digital Very Large Scale Integration (VLSI) chips. VLSI implementations have proceeded in two inter-related directions: higher performance and higher density (more devices per unit area). While modern VLSI chips have achieved astonishingly high levels of performance and chip density there is a very strong demand for even higher levels.

One serious impediment to achieving what is demanded from VLSI devices is power consumption. As a rule of thumb higher performance requires more power. But, more power produces more heat, which increases failure rates. Consequently, power consumption is the predominant challenge in improving modern high performance systems.

Almost all modern VLSI chips are clocked. That is, the operations of the gates within a VLSI chip are synchronized to act together by clock signals. So long as the gates can keep up, the higher the clock rate the faster the performance. Unfortunately, as clock rates and VLSI chip densities increase it becomes very difficult to ensure that all of the chips can keep up with the clocks. One reason for this is that each sequential element in a VLSI chip needs its own clock signal, but not all devices are the same distance from the clock signal source, which means that all clock lines are not the same length and that associated parameters such as distributed capacitances and resistances, differ. Different lengths coupled with unavoidable signal delays caused by distributed resistances and capacitances mean that clock signals arrive at different devices at different times (clock skew). Such can effectively limit the performance of a VLSI chip.

Compounding the clocking problems is the fact that clocking requires power. In fact, the on-chip clock distribution network (CDN) of modern VLSI chips often consumes more than 35% of the total chip power and can occasionally require as much as 70%.

Various approaches have been attempted in the prior art to address VLSI clocking problems. One approach to decreasing CDN power consumption is to use resonant clocks in the VLSI clock distribution network. FIG. 1 illustrates an LC tank resonant clock 10.

Ideally, by oscillating clock energy between the electric field of capacitance Cs 12 and the magnetic field of inductor Ls 14 the clock energy is recycled and power consumption is decreased (ideally to zero). The resonant frequency of the tank (Cs 12 and Ls 14) without parasitic Cd 16, $R_{wr}$ 18 and $R_{w1}$ 20 is ideally:

$$f = 1/2\pi\sqrt{L_sC_s}$$

However, to provide the required CMOS logic levels of zero and $V_{dd}$ 8 a positive bias is obtained by adding a decoupling capacitor $C_d$ 16 on the grounded end of the paralleled inductor Ls 14, as shown in FIG. 1. That additional capacitance $C_d$ 16 creates a parasitic series LC tank circuit. Careful sizing of $C_d$ 16 must be taken to ensure that the series resonant frequency is well separated from the parallel resonant frequency, i.e.:

$$1/2\pi\sqrt{L_sC_d} \ll 1/2\pi\sqrt{L_sC_s}$$

In practice, pure series/parallel LC tanks are not seen because of unavoidable wire resistances, specifically: $R_{w1}$ 20, the conductor resistance between the clock driver and the inductor, $R_{wr}$ 18, the conductor resistance between the inductor and the clock capacitor Cs 12, the driving element resistance $R_{dr}$, 22 and the parasitic resistance of the inductor $R_s$ 24.

Those unavoidable wire resistances shift the resonance frequency of the LC tank resonant clock 10 downward and change that oscillator's Q. Furthermore, the placement of an LC tank in the clock distribution determines the attenuation. Consequently, where the LC tanks are placed in a clock distribution network is of utmost concern.

On-chip inductors can be created using normal metal layers, special layers in RF processes, or using free-standing MEMs devices. But, the on-chip inductors 26 using square spiral topologies with ground shields as shown in FIG. 2 are common and useful. It will be assumed herein that the inductance of such on-chip inductors 26 is:

$$L = 0.0002l\left[\ln\frac{2l}{w+t} + 0.5 + \frac{w+t}{3l}\right]nH$$

where n is the number of turns, w is the width of a trace, t is the thickness of the metal, l is the length of trace and S is the spacing between turns. Given n, s, w, $d_i$ (inner diameter of the square spiral inductor), $d_o$ (outer diameter of the square spiral inductor) the chip areas occupied by an on-chip inductor 26 is $$Area = d_0^2 = (d_i + 2n(s+w))^2$$

While very promising in theory, VSLI resonant clock networks are seldom used, usually being restricted to VLSI clock distribution networks that use H-trees. Referring now to FIG. 3a, an H-tree 30 is a conductor topology for minimizing clock skew by making interconnections to VLSI circuit "subunits" equal in length by using a regular pattern of clock line conductors 32. An H-tree 30 is a symmetric tree topology and has been used with drive clock grids having driver buffers in the top-level tree. Clock grids are formed by a set of vertical and horizontal wires with stubs connecting clock sinks. Refer to FIG. 3b for a depiction of a resonant H-tree and grid 36 augmented by distributed LC tanks placed at H-trees. While an H-tree can have many different levels, in the prior art the LC tanks 35 were always placed at the input of the second level in a 2-level H-tree network as shown in FIG. 3a.

While conceptually interesting, VLSI resonant clock distribution networks are seldom if ever used. A major problem is that prior art resonant clock distribution networks required even (balanced) distribution of gates, terminals, loads, distributed capacitance and inductances and conductors. Uneven loading of resonant clock distribution networks significantly alters resonant behavior and can prevent correct functionality of LC tanks. As LC tanks can only be placed in the H-tree 30, and one LC tank only resonates with one clock sector (as shown in FIG. 3*a*) which result in a large amount of on-chip inductors. Such limitations are neither practical nor realistic in actual VLSI designs.

Instead of placing LC tanks in the H-tree, LC tanks 50 can be connected directly to the clock grid 52 to save power more efficiently as shown in FIG. 4. However, resonant clock grids present several unique challenges to automated designs compared to fully buffered grids. First, the parasitic resistances and inductances in a clock distribution alter the resonant frequency. Second, the resistances add attenuation at high frequencies. Third, the unsymmetrical structure of clock network and unbalanced load require precious inductor sizing. Fourth, the shared output node in a resonant grid causes interactions between the buffers and the LC tanks 50. Such factors all lead to altered resonant frequencies and phase conflicts. No successful prior art method to address those problems has been implemented.

Implementing VSLI resonant clock grids requires implementing the clock grid 52 conductors and then obtaining the correct LC placement and sizing. When clock distribution networks incorporate resonant tanks the LC tanks 50 are inserted at points in the clock grid 52 so as to resonate each subunit clock sector.

Therefore, a technique that minimizes clock skew and power with minimum inductor area overhead by implementing LC tank 50 placement, sizing and driver buffer sizing would be beneficial. Ideally, the technique would be suitable for automatic implementation at the design level.

BRIEF SUMMARY OF THE INVENTION

The principles of the present invention provide for techniques for implementing LC resonant tank networks that minimize clock skew and power with minimum inductor area overhead by implementing suitable LC tank placement, sizing and driver buffering.

Those principles are incorporated in a system and method that follows the methodology of FIG. 5 using the structure in FIG. 4. The system and method begins by generating an initial VLSI clock grid 52 for incorporation on a silicon die. An input grid buffer is then sized and implemented for the VLSI clock grid 52. LC tanks 50 are then placed and sized in the clock grid 52 to implement a resonant tank clock grid 70. The input grid buffer is then resized. A check of the resonant tank design criteria is then made. If the design criteria are met the resonant VLSI clock grid 52 with its LC tanks 50 is implemented. If not, another attempt at implementing suitable LC tank 50 placements and sizing is made. The process iterates until a VLSI clock grid that meets the design criteria is obtained. An AC-based sizing formulation is implemented that uses information about the clock network distributions to simultaneously reduce phase conflicts and the total buffer area.

The initial grid and input grid buffer 52 are implemented using a standard clock grid methodology. However, placing and sizing LC tanks 50 on the clock grids 52 and buffer re-sizing methods are implemented according to algorithms described below. The principles of the present invention enable the locating, placing, and sizing procedures to be fully automated while also enabling extremely significant power savings in the resulting devices.

BRIEF DESCRIPTION OF THE DRAWINGS

The advantages and features of the present invention will become better understood with reference to the following detailed description and claims when taken in conjunction with the accompanying drawings, in which like elements are identified with like symbols, and in which:

FIG. 5 is a flow chart of a system and method of implementing LC resonant tank networks in accord with the principles of the present invention; and.

DETAILED DESCRIPTION OF THE INVENTION

The presently disclosed subject matter now will be described more fully hereinafter with reference to the accompanying drawings in which one embodiment is shown. However, it should be understood that this invention may take many different forms and thus should not be construed as being limited to the embodiment set forth herein.

All publications mentioned herein are incorporated by reference for all purposes to the extent allowable by law. In addition, in the figures, identical numbers refer to like elements throughout. Additionally, the terms "a" and "an" as used herein do not denote a limitation of quantity, but rather denote the presence of at least one of the referenced items.

Figure 1:
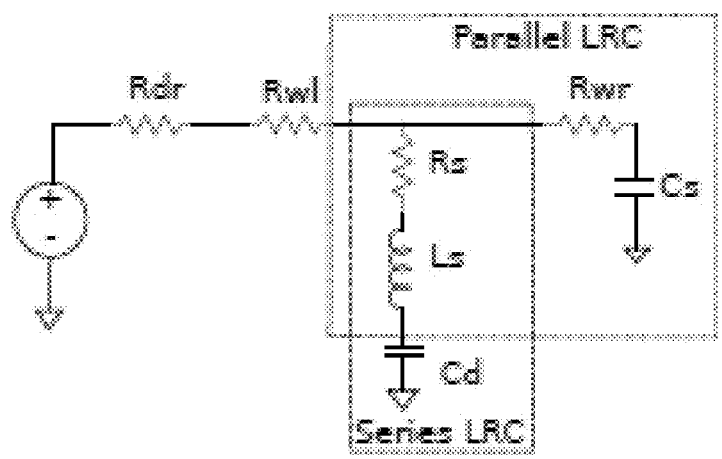
FIG. 1 is a depiction of a prior art LC tank 10 network.
Figure 2:
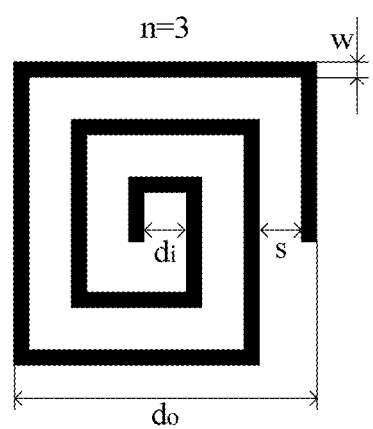
FIG. 2 illustrates a suitable inductor 26 for use in the present invention.
Figure 3:
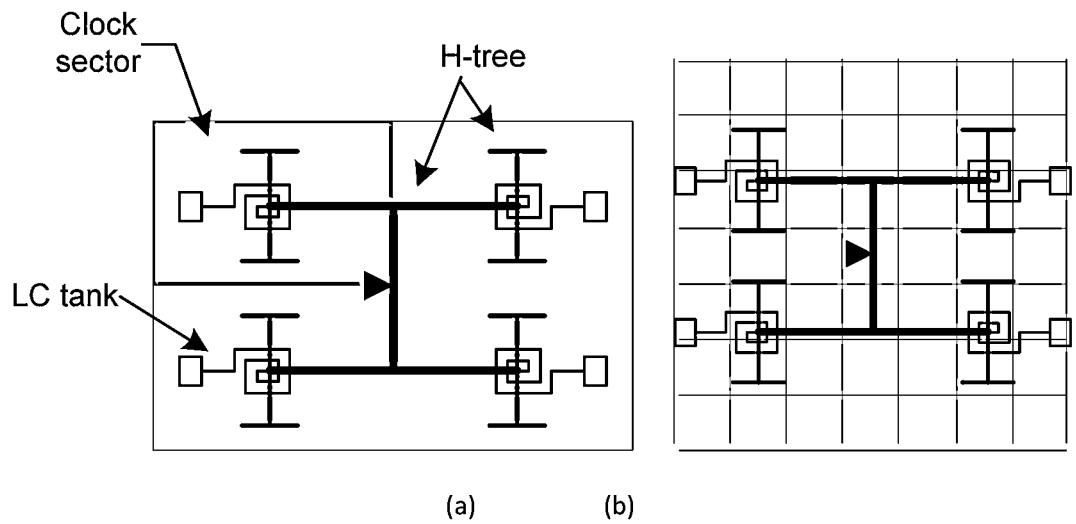
FIG. 3*a* is a perspective view of a prior art H-tree 30 having LC tank networks.
FIG. 3*b* is a schematic depiction of the H-tree 30 driven clock grid of FIG. 3*a*.
Figure 4:
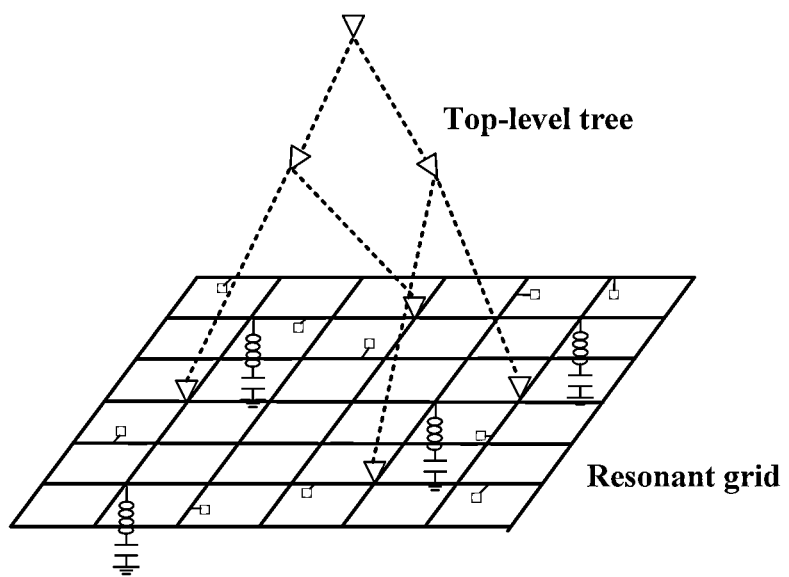
FIG. 4 is a schematic depiction of resonant clock grid 70 having a top-level tree with LC tanks 50 inserted at clock grid.

As previously described, parasitic resistances of clock networks shift their resonant frequency and cause attenuated voltage swings that can result in malfunction of logic circuit. The currents that pass through an LC tank 10, 50 (see FIGS. 1 and 4) can be very large at resonant frequency. Distributing LC tanks 50 as shown in FIG. 4 reduces the peak current passing through each individual LC tank 50. It is impractical to resonate a clock grid with one LC tank while having a satisfactory voltage swing for one large chip. Furthermore, the on-chip inductors 26, see FIG. 2, would take extra metal layer area. Referencing FIG. 4, therefore, for proper operation the LC tanks 50 must be placed and sized on the clock distribution grid 52 to address those issues while limiting the inductor 26 to a reasonable inductor area.

Figure 5:
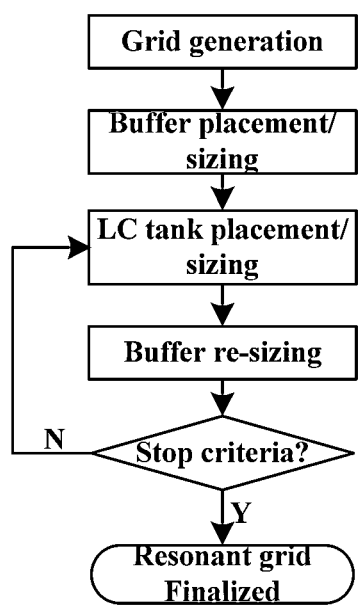

Referring now to FIG. 5, the inventive LC resonant tank design system and method 500 begins by generating an initial clock distribution grid 52, step 502. An input grid buffer for the resonant tank clock grid 70 is then sized and implemented, step 504. Then LC tanks 50 are placed and sized on the clock distribution grid 52, step 506. An AC-based buffer resizing, step 508 is then performed to ensure that the buffer size is sufficient to drive the resonant tank clock grid 70. This helps avoid over sizing of the buffers. Then the resonant tank clock grid 70 is compared to various stop criteria (described in more detail subsequently), step 510. If the stop criteria are not met a loop is made back to step 506 for LC tank 50 re-placed and re-sizing followed by step 508, buffer resizing. Looping continues until the stop criteria are met in step 510. Then the resonant tank clock grid 70 is finalized, step 512. At that time the design of the resonant tank clock grid 70 is complete and the resonant tank clock grid 70 can be implemented as part of a VLSI circuit.

The LC resonant tank design system and method 500 starts with laying out a uniform clock grid 52 that is suitably buffered to satisfy design slew and skew constraints. For example, a design target might have a skew budget of ≤25 μs which would be a reasonable design criteria for a 1 GHz ASIC clock frequency. Given those constraints an optimal solution is obtained for a given resonant tank clock grid 70 in terms of skew and energy loss. If an inductor 26 is added to every node in the clock distribution grid 52 and then sized to resonate using only half the adjacent wire capacitances (according to a simple π-interconnect model), the clock distribution grid 52 exhibits ideal performance in terms of skew and power saving. The size of the required inductors 26, however, is extremely large since the resulting very small capacitances would require very large inductors 26 at a fixed operating frequency.

However, the ideal resonant solution serves as a good starting point and is thus reduced to a more practical solution while considering the total inductor 26 area, skew, and voltage swing. The following cost function is used to evaluate every inductor 26:

$$cost_n = \alpha \times \frac{L_n}{L_{avg}} + (1-\alpha) \times \frac{S\_LC_{avg}}{S\_LC_{min}^n}$$

where $L_n$ is the inductance of LC tank n, $S\_LC_{avg}$ is the average resistance from sink to its nearest LC tank, and $S\_LC_{min}^m$ is the minimum resistance from sink to LC tank n.

The first term of the foregoing equation penalizes larger than average inductors 26. A small capacitance requires a large inductance to resonant at a given frequency, fo. Large inductances, however, occupy more chip area and resonate with very small capacitance. Therefore, large inductors 26 are inefficient in terms of area usage. The second term of the foregoing equation ensures that each sink has nearly the same resistance to an inductor 26. If inductors 26 have smaller resistance path to a sink they will have a phase offset from sinks that have longer resistance path from an inductor 26. That phase offset appears as clock skew. The two cost terms are weighted depending on the benchmark profile. If a benchmark has relatively high sink capacitance density compared to the clock circuit grid the first term is more important. If not, the second term is more important. In general, for a small dense chip more weight should be placed on the distance since only a small number of inductors 26 can fit on the chip.

A pseudo-code algorithm for inductor 26 insertion and sizing is:
Input: Grid nodes N; resonant frequency $f_0$; maximum inductor area $A_{max}$; skew constraint SK.
Output: Inductors size and location L

```
1:    L←N
2:    L_sizing( )
4:    while ΣArea(L) > A_max && skew < SK do
5:        for each l_i ∈ L do
6:            cost_i = α × l_i/L_avg + (1-α) × S_LC_avg/S_LC_min^n
7:        end for
8:        sort_cost(cost)
9:        remove_lc (10% of L with largest cost)
10:       L_sizing( )
11:       if ΣArea(L) < 1.2 × A_max then
12:           AC_buf_sizing( )
13:           timing_power_analysis( )
14:       end if
15:   end while
```

According to the pseudo-code an inductor 26 is added to every node and sized at the beginning (lines 1-2). Lines 5-9 evaluate the cost of each inductor 26 and the largest 10% in terms of cost are removed. After removing the LC tanks 50, the capacitance that was resonated by each inductor tank is re-distributed to nearby inductors 26 according to the following pseudo-code Algorithm which re-sizing the remaining inductors 26:

Pseudo-code algorithm for inductor sizing L_sizing( ),
Input: Grid nodes N; inductors L; resonant frequency $f_0$
Output: Sizes for each inductor L

```
1:    C_n ← Σ(wire_cap, buf_cap, sink_cap) connected to n, n ∈ N
2:    CR = 0 // Cap, resonates with each inductor
3:    for Each n ∈ N do
4:        Find inductor l_i, which is resistively closest to n, l ∈ L
5:        CR_i += C_n
6:    end for
7:    l_i = 1/((2πf_0) × CR_i)
```

After removing the inductors 26, all the remaining inductors 26 are re-sized (Lines 10, first algorithm). Line 12 performs a new AC-based buffer sizing, which is discussed in more detail below. By resizing the buffers, more accurate capacitance estimations, and hence more accurate inductor sizes are obtained.

To save run time, the buffers are only resized when their total inductor area is less than $1.2 \times A_{max}$. Line 13 (first algorithm) calls HSPICE for accurate power and timing analysis of the resonant tank clock grid 70. This analysis shows how the resonant tank clock grid 70 performance changes with LC removal and is not really necessary. The algorithms are reiterated until the total inductor area is less than a user-specified maximum inductor area $A_{max}$ and skew is within the maximum skew limit SK. Other criteria, such as power and skew, also can be used as the stopping criteria instead.

The second algorithm describes the methodology used to calculate how much capacitance CR resonates with each inductor l and how to size the inductors 26. The capacitance at each grid node is the sum of wire capacitance, sink capacitance and buffer capacitances which are connected to this node (Line 1, second algorithm). For each node n in the grid, the lowest resistance path from n to every LC tank (Line 4) is found. It is assumed that the capacitance of node n, $C_n$, will resonate with the inductor 26 which is resistively closest to n (Line 5). The total capacitance resonating with inductor i is updated by adding $C_n$. With the capacitance resonated by inductor i, the inductance is calculated in Line 7.

In resonant clock grids the buffers are needed 1) to supplement for the power loss due to parasitic resistances and 2) to compensate for unbalanced resonant frequencies to reduce phase difference (i.e. skew). Insufficiently sized buffers will not be able to drive the resonant tank clock grid 70 and will not enable a full voltage swing at the sinks. However, while unnecessarily large buffers will guarantee full swing sink voltages the power consumption will be excessive. Therefore, without proper buffer sizing the power savings from the LC tanks may be nullified.

In small signal analysis, non-linear circuit components are replaced by their linear small-signal models. The voltage, current, and RLC in a circuit are represented as complex numbers which include both phase and magnitude information. Using the complex admittance values of the clock distribution wires, sinks and LC tanks, the resonant mesh as a complex linear system is formulated as:

$$GV = I$$

where G is the complex admittance matrix of the mesh, I represents the mesh buffer driving currents, and V represents the (complex) voltages of each sink/node in the grid. The complex voltages V include information about the voltage amplitude and phase shift of each node in the clock distribution. The complex voltage is:

$$v_i = x_i + jy_i$$

where $x_i$ and $y_i$ are both real numbers.
The amplitude and phase are:

$$|v_i| = \sqrt[2]{x_i^2 + y_i^2}$$

$$\phi_{v_i} = \tan^{-1}\left(\frac{y_i}{x_i}\right)$$

The amplitude of the voltages v, at each sink should be large enough for the CMOS sequential elements being driven to fully switch. This objective was previously considered in the transmission line formulation of resonant H-trees (see, for example, J. Rosenfeld and E. Friedman, "Design methodology for global resonant H-tree clock distribution networks," GLSVLSI; 2006), but has not been explicitly considered in resonant grids. More importantly, the phase differences in voltages in a resonant clock grid create phase conflicts. Phase conflicts can reduce the efficiency when multiple buffers or LC tanks 50 are out of phase and retard each other from switching. In addition, phase conflict at the sinks indicates that the sinks will reach maximum voltages at different times which results in phase-conflict induced skew. The phase of the complex voltage v, at each node should be matched at the resonant frequency to prevent this. To properly optimize a resonant tank clock grid 70, buffers should be sized such that 1) each sink has appropriate voltage amplitude; 2) the phase of each node voltage matches the buffer phase; and 3) the phase difference among all sink voltages is minimized.

A pseudo-code algorithm for AC-based buffer sizing is:
Require: Clock grid with LC tanks; buffers B; maximum/minimum buffer size $b_{max}/b_{min}$
Ensure: $\forall v_s \geq V_{swing}$, $s \in S$

```
1:  b_cur = (b_min + b_max)/2
2:  set_buf_size (b = b_cur, b ∈ B)
3:  L_sizing( )
4:  while (b_max − b_min) > 0.1 do
5:    AC_analysis( )
6:    if v_min − MIN(v_s, s ∈ S) < V_swing, then
7:      b_min = b_cur
8:    else
9:      b_max = b_cur
10:   end if
11:   b_cur = (b_min + b_max)/2
12:   set_buf_size (b_i = b_cur, b_i ∈ B)
13:   L_sizing( )
14: end while
```

The AC-based buffer sizing method is based on small signal analysis in the frequency domain. A bisection method is used to find the minimum buffer sizes to guarantee the full voltage swing at the sink nodes. The original buffer size is set to medium value of $b_{max}$ and $b_{min}$ (Lines 1-2). In function AC_analysis (Line 5), a matrix is built using nodal analysis at the target resonant frequency and obtains the complex voltage vector solution by solving the complex linear system. By comparing the minimum voltage swing of all sink nodes $v_{min}$ with the required $V_{swing}$ (Line 6), the buffer sizes are increased or decrease (Lines 7-10). In the original buffered clock grid, each buffer has a different buffer size. In resonant grids, however, the main power consumption is because of the parasitic resistance in the circuit and only small size buffers are needed to drive the resonant clock grid. For simplicity, all buffers are set to the same size in function set_buf_size( ) (Line 2 and line 12). After altering the buffer sizes, the buffer output capacitance is changed and we must update the capacitances covered by each LC tank 50 and recalculate the inductances (Line 3 and line 13).

The buffer sizing algorithm takes the initial buffer positions as inputs and focuses on the voltage swing. Phase conflicts and phase-conflict induced skews are not directly considered. However, inductor resizing will minimize the phase-conflict induced by inaccurate inductor sizes.

Figure 6:
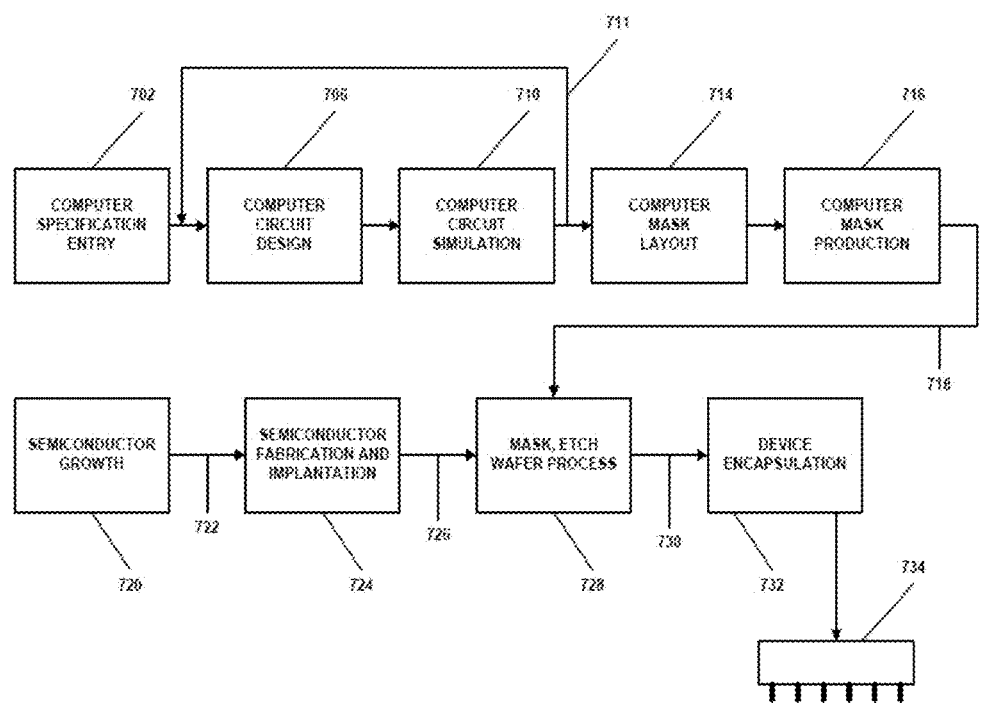
FIG. 6 illustrates the fabrication of an integrated circuit that implements the principles of the present invention.

As a final matter decoupling capacitors Cd must be added (see FIG. 1) to provide a positive bias to the clock grid. Those decoupling capacitors must be appropriately sized to be $10 \times CR_i$. This will guarantee the resonant frequency of the decoupling capacitance is much less than the clock grid resonant frequency. The result of the techniques for implementing an LC resonant tank networks that minimize clock skew and power with minimum inductor area overhead is an integrated circuit produced by and incorporating such LC resonant tank networks FIG. 6 illustrates how the present invention produces an integrated circuit. There are three main processes that come into play. First entering device specifications and then implementing a circuit design and producing a wafer mask. Second, growing a semiconductor ingot and processing it to a wafer ready for device fabrication. Finally fabricating an integrated circuit using the produced wafer mask and the wafer and then cutting the wafer to produce an IC chip which is then encapsulated as an integrated circuit. Each individual function is complex, but except for incorporating the present invention to accomplish the required tasks, are well known and have been used for many years.

The first set of fabrication actions begin with an operator entering specification data on an input terminal 702. Specification data is entered in the proper format to describe the performance of the desired integrated circuit. With the specifications fully entered a computer 706 implements a circuit design. During circuit design a computer 710 simulates the circuit being designed to ensure that it will meet the design specifications. The process of having a computer or computers design and simulate the circuit reiterates 711 until the circuit being designed fulfills the design specifications. The principles of the present invention relate to the circuit design process.

After the circuit has been designed a computer 714 performs a mask lay out. That is, the computer 714 accepts the final circuit design and converts that circuit design into a physical layout of an integrated circuit mask that will be used in later stages to produce the integrated circuit. After mask layout is complete a computer 716 controls the production of a mask, represented by line 718.

Meanwhile, the second set of production functions has been ongoing. First a semiconductor is grown in a semiconductor production facility 720 to produce a semiconductor ingot, represented by line 722. That ingot 722 is sent to a Semiconductor fabrication and implantation facility 724 where the ingot 722 is diced into wafers, polished, and ion implanted to produce a wafer 726. The wafer 726 is then fabricated to retain a plurality of individual integrated circuit devices using the mask 718. Thus the present invention is physically incorporated into integrated circuit devices. The wafer with its individual integrated circuit devices, represented by line 730, is then sent to a device encapsulation plant 732 where the wafer 730 is cut into individual integrated circuits 734 which are then encapsulated for subsequent use.

The end result of this complex process is an individual integrated circuit 734 that benefits from and that incorporates the principles of the present invention.

It is to be understood that while the figures and the above description illustrates the present invention, they are exemplary only. They are not intended to be exhaustive or to limit the invention to the precise forms disclosed, and obviously many modifications and variations are possible in light of the above teaching. Others who are skilled in the applicable arts will recognize numerous modifications and adaptations of the illustrated embodiments that remain within the principles of the present invention. Therefore, the present invention is to be limited only by the appended claims.

What is claimed:

1. A method of designing VLSI clock distribution networks, comprising the steps of:
    (a) obtaining a set of clock distribution network design criteria;
    (b) laying out an initial clock grid network;
    (c) implementing and sizing input buffers;
    (d) placing and implementing LC tanks to resonate with said clock grid network laid out in step (b);
    (e) resizing the input buffers in view of LC tanks placed in step (d) based on the results of an AC analysis;
    (f) checking whether the clock distribution network design criteria are met when using the resized input buffers;
    (g) if the clock distribution network design criteria are met in step (f), implementing a VLSI clock distribution network using the clock grid network, resized input buffers, and placed and implemented LC tanks; and
    (h) if the clock distribution network design criteria are not met in step (f), looping back to step (d).

2. The method of claim 1, wherein step (e) is implemented using an AC-based sizing formulation.

3. The method of claim 2, further including a step (i) of attaching a DC bias capacitance to each LC tank.

4. The method of claim 2, wherein step (d) includes sizing each LC tank using a driver resistance of a clock driver.

5. The method of claim 1, wherein step (a) includes slew and skew constraints.

6. The method of claim 5, wherein step (a) includes inductor size constraints for each inductor determined by:

$$cost_n = \alpha \times \frac{L_n}{L_{avg}} + (1-\alpha) \times \frac{S\_LC_{avg}}{S\_LC_{min}^n}$$

wherein Ln is the inductance of LC tank n, S_LCavg is the average resistance from sink to its nearest LC tank, and S_LCmmin is, the minimum resistance from sink to LC tank n.

7. The method of claim 1, wherein step (d) includes performing the following Pseudo-code algorithm:
Input: Grid nodes N; L is an inductor, resonant frequency f0; maximum inductor area Amax and skew constraint SK
Output: Inductors size and location L
Input: Grid nodes N; resonant frequency f0; maximum inductor area Amax; skew constraint SK
Output: Inductors size and location L

```
1:   L←N
2:   L_sizing( )
4:   while ΣArea(L) > Amax && skew < SK do
5:     for each li ∈ L do
6:       cost_i = α × (l_i / L_avg) + (1-α) × (S_LC_avg / S_LC_min^n)
7:     end for
8:     sort_cost(cost)
9:     remove_lc (10% of L with largest cost)
10:    L_sizing( )
11:    if ΣArea(L) < 1.2 Amax then
12:      AC_buf_sizing( )
13:      timing_power_analysis( )
14:    end if
15:  end while.
```

8. The method of claim 7, wherein step (d) includes performing for an inductor L the following Pseudo-code algorithm for inductor sizing L_sizing( ):
Input: Grid nodes N; inductors L; resonant frequency f0
Output: Sizes for each inductor L

```
1:   Cn←Σ(wire_cap, buf_cap, sink_cap) connected to n, n ∈ N
2:   CR = 0  // Cap, resonates with each inductor
3:   for each n ∈ N do
4:     Find inductor li, which is resistively closest to n, l ∈ L
5:     CRi += Cn
6:   end for
7:   l_i = 1 / ((2πf_0) × CR_i).
```

9. The method of claim 2, wherein step (e) includes performing the following pseudo-code algorithm:
Require: Clock grid with LC tanks; buffers B; maximum/minimum buffer size $b_{max}/b_{min}$
Ensure: $\forall v_s \geq V_{swing}, s \in S$

```
1:   b_cur - (b_min + b_max)/2
2:   set_buf_size (b = b_cur, b ∈ B)
3:   L_sizing( )
4:   while (b_max - b_min) > 0.1 do
5:     AC_analysis( )
6:     if v_min = MIN(v_s, s ∈ S) < V_swing, then
7:       b_min = b_cur
8:     else
9:       b_max = b_cur
10:    end if
11:    b_cur = (b_min + b_max)/2
12:    set_buf_size (b_i = b_cur, b_i ∈ B)
13:    L_sizing( )
14:  end while.
```

10. A system for designing VLSI clock distribution networks, including:
    a computer for inputting a set of clock distribution network design criteria;
    a computer for laying out an initial clock grid network design by first implementing and sizing input buffers for the clock grid network and then by placing and implementing LC tanks to resonate with the clock grid network;
    a computer for simulating the clock grid network by resizing the input buffers in view of the placed and implemented LC tanks based on an AC analysis;
    a computer for simulating whether the clock distribution network design criteria are met when using the resized input buffers;

a computer for implementing a resonant grid using the resized input buffers, clock grid, and LC tank placements and implementations if the clock distribution network design criteria are met; and looping back to placing and implementing LC tanks if the clock distribution network design criteria are not met.

11. The system of claim 10, wherein the computer resizes the input buffers using an AC-based sizing formulation.

12. The system of claim 11, wherein the computer for laying out an initial clock grid network further attaches a DC bias capacitance to each LC tank.

13. The system of claim 11, wherein placing and implementing LC tanks includes sizing each LC tank based on a driver resistance of a clock driver.

14. The system of claim 10, wherein the input clock distribution network design criteria includes slew and skew constraints.

15. The system of claim 14, wherein said clock distribution network design criteria includes inductor size constraints for each inductor:

$$cost_n = \alpha \times \frac{L_n}{L_{avg}} + (1-\alpha) \times \frac{S\_LC_{avg}}{S\_LC_{min}^n}$$

wherein Ln is the inductance of LC tank n, S_LCavg is the average resistance from sink to its nearest LC tank, and S_LCmmin is the minimum resistance from sink to LC tank n.

16. The system of claim 10, wherein the computer placing and implementing LC tanks does so in accord with the following Pseudo-code algorithm:

Input: Grid nodes N; resonant frequency f0; maximum inductor area Amax; skew constraint SK Output: Inductors size and location L

```
1:   L←N
2:   L_sizing( )
4:   while ΣArea(L) > Amax && skew < SK do
5:     for each li ∈ L do
6:       cost_i = α × l_i/L_avg + (1-α) × S_LC_avg/S_LC_min^n
7:     end for
8:     sort_cost(cost)
9:     remove_lc (10% of L with largest cost)
10:    L_sizing( )
11:    if ΣArea(L) < 1.2 Amax then
12:      AC_buf_sizing( )
13:      timing_power_analysis( )
14:    end if
15:  end while.
```

17. The system of claim 16, the computer placing and implementing LC tanks performs for inductor L the following Pseudo-code algorithm:

Input: Grid nodes N; inductors L; resonant frequency f0

Output: Sizes for each inductor L

```
1:   Cn←Σ(wire_cap, buf_cap, sink_cap) connected to n, n ∈ N
2:   CR = 0// Cap. resonates with each inductor
3:   for each n ∈ N do
4:     Find inductor li, which is resistively closest to n, l ∈ L
5:     CRi += Cn
6:   end for
7:   l_i = 1/((2πf_0) × CR_i).
```

18. The system of claim 10, wherein the computer resizing the input buffers performs the following pseudo-code algorithm:

Require: Clock grid with LC tanks; buffers B; maximum/minimum buffer size $b_{max}$/$b_{min}$ Ensure: $\forall v_s \geq V_{swing}$, s ∈ S

```
1:   b_cur – (b_min + b_max)/2
2:   set_buf_size (b = b_cur, b ∈ B)
3:   L_sizing( )
4:   while (b_max – b_min) > 0.1 do
5:     AC_analysis( )
6:     if v_min = MIN(v_s, s ∈ S) < V_swing, then
7:       b_min = b_cur
8:     else
9:       b_max = b_cur
10:    end if
11:    b_cur = (b_min + b_max)/2
12:    set_buf_size (b_i = b_cur, b_i ∈ B)
13:    L_sizing( )
14:  end while.
```

19. A semiconductor device having a clock grid, comprising:

a clock grid conductor;

a set of input buffers driving signals onto the clock grid conductor; and a set of resonant LC tanks located on the clock grid;

wherein the clock grid conductor, input buffers, and LC tanks are implementations of a design comprised of:

obtaining a set of clock distribution network design criteria;

laying out an initial clock grid network;

implementing and sizing input buffers;

placing and implementing LC tanks to resonate with the clock grid network;

resizing the input buffers in view of LC tanks based on the results of an AC analysis;

checking whether the clock distribution network design criteria are met when using the resized input buffers;

if the clock distribution network design criteria are met then implementing a VLSI clock distribution network using the clock grid network, resized input buffers, and placed and implemented LC tanks; and if the clock distribution network design criteria are not met looping back to placing and implementing LC tanks to resonate with the clock grid network.

20. The semiconductor device according to claim 19, wherein the wherein the implementations of the clock grid conductor, the input buffers, and the LC tanks include fabricating a wafer mask derived from the design.

* * * * *